United States Patent
Chuang et al.

(10) Patent No.: US 8,836,035 B2
(45) Date of Patent: Sep. 16, 2014

(54) METHOD AND APPARATUS FOR REDUCING GATE RESISTANCE

(75) Inventors: Harry Hak-Lay Chuang, Hsinchu (TW); Lee-Wee Teo, Singapore (SG); Han-Gan Chew, Singapore (SG)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 676 days.

(21) Appl. No.: 12/721,159

(22) Filed: Mar. 10, 2010

(65) Prior Publication Data
US 2011/0221009 A1    Sep. 15, 2011

(51) Int. Cl.
| | |
|---|---|
| H01L 29/66 | (2006.01) |
| H01L 21/28 | (2006.01) |
| H01L 27/088 | (2006.01) |
| H01L 29/78 | (2006.01) |
| H01L 29/49 | (2006.01) |
| H01L 29/51 | (2006.01) |
| H01L 27/02 | (2006.01) |
| H01L 21/8234 | (2006.01) |

(52) U.S. Cl.
CPC .. H01L 21/823437 (2013.01); H01L 29/66545 (2013.01); H01L 21/28088 (2013.01); *H01L 21/823475* (2013.01); H01L 27/088 (2013.01); H01L 29/78 (2013.01); H01L 29/4966 (2013.01); H01L 29/517 (2013.01); H01L 27/0207 (2013.01); H01L 29/66575 (2013.01)
USPC ...... 257/365; 257/327; 257/410; 257/E27.06; 257/E21.409; 438/287

(58) Field of Classification Search
CPC ................. H01L 21/02697; H01L 21/823475; H01L 29/78618; H01L 21/823437; H01L 21/823456; H01L 27/088; H01L 23/528
USPC ................. 257/288, 327, 344, 365, 408, 410, 257/E29.255, E27.06, E21.409; 438/387
See application file for complete search history.

(56) References Cited

U.S. PATENT DOCUMENTS

| | | | |
|---|---|---|---|
| 4,587,711 A | 5/1986 | Godejahn, Jr. | |
| 6,242,354 B1 | 6/2001 | Thomas | |
| 6,818,932 B2 * | 11/2004 | Nii et al. | 257/288 |
| 7,034,365 B2 * | 4/2006 | Park et al. | 257/365 |
| 7,091,570 B2 * | 8/2006 | Caimi et al. | 257/412 |
| 7,141,476 B2 * | 11/2006 | Dao | 438/283 |
| 7,320,909 B2 | 1/2008 | Park et al. | |
| 8,217,428 B2 | 7/2012 | Becker et al. | |
| 2005/0045958 A1 * | 3/2005 | Ichikawa | 257/362 |
| 2011/0018073 A1 * | 1/2011 | Wang et al. | 257/411 |

* cited by examiner

*Primary Examiner* — Colleen A Matthews
*Assistant Examiner* — Colleen E Snow
(74) *Attorney, Agent, or Firm* — Haynes and Boone, LLP

(57) ABSTRACT

An apparatus has a semiconductor device that includes: a semiconductor substrate having a channel region, a high-k dielectric layer disposed at least partly over the channel region, a gate electrode disposed over the dielectric layer and disposed at least partly over the channel region, wherein the gate electrode is made substantially of metal, and a gate contact engaging the gate electrode at a location over the channel region. A different aspect involves a method for making a semiconductor device that includes: providing a semiconductor substrate having a channel region, forming a high-k dielectric layer at least partly over the channel region, forming a gate electrode over the dielectric layer and at least partly over the channel region, the gate electrode being made substantially of metal, and forming a gate contact that engages the gate electrode at a location over the channel region.

20 Claims, 9 Drawing Sheets

METHOD AND APPARATUS FOR REDUCING GATE RESISTANCE

BACKGROUND

The semiconductor integrated circuit (IC) industry has experienced rapid growth. Technological advances in IC materials and design have produced generations of ICs where each new generation has smaller and more complex circuits than the previous generation. However, these advances have increased the complexity of processing and manufacturing ICs and, for these advances to be realized, similar developments in IC processing and manufacturing are needed. In the course of integrated circuit evolution, functional density (i.e., the number of interconnected devices per chip area) has generally increased while geometry size (i.e., the smallest component or line that can be created using a fabrication process) has decreased. This scaling-down process generally provides benefits by increasing production efficiency and lowering associated costs. Such scaling down also produces a relatively high power dissipation value, which may be addressed by using low power dissipation devices such as complementary metal-oxide-semiconductor (CMOS) devices.

During the scaling trend, various materials have been used for the gate electrode and gate dielectric for CMOS devices. One approach is to fabricate these devices with a metal material for the gate electrode and a high-k dielectric for the gate dielectric. However, high-k metal gate (HKMG) devices often require additional layers in the gate structure. For example, work function layers may be used to tune the work function values of the metal gates. Additionally, barrier (or capping) layers may assist in the HKMG manufacturing process. Although these approaches have been satisfactory for their intended purpose, they have not been satisfactory in all respects. For example, each additional layer in the HKMG gate stack may increase the effective resistivity of the gate stack. In analog HKMG devices in particular, increased resistance may degrade performance.

SUMMARY

According to one of the broader forms of the invention, an apparatus has a semiconductor device that includes: a semiconductor substrate having a channel region, a high-k dielectric layer disposed at least partly over the channel region, a gate electrode disposed over the dielectric layer and disposed at least partly over the channel region, wherein the gate electrode is made substantially of metal, and a gate contact engaging the gate electrode at a location over the channel region.

According to another of the broader forms of the invention, an apparatus has an integrated circuit including: a semiconductor substrate having spaced first and second channel regions and an insulating region, a high-k first dielectric layer disposed at least partly over the first channel region, a second dielectric layer disposed at least partly over the second channel region and at least partly over the insulating region, a first gate electrode disposed over the first dielectric layer and at least partly over the first channel region, wherein the first gate electrode is made substantially of metal, a second gate electrode disposed over the second dielectric layer, and having a first portion disposed over the second channel region and a second portion disposed over the insulating region, a first gate contact engaging the first gate electrode at a location over the first channel region, and a second gate contact engaging the second gate electrode at a location over the insulating region, the second gate electrode being free of engagement with contacts over the second channel.

According to yet another of the broader forms of the invention, a method for making a semiconductor device includes: providing a semiconductor substrate having a channel region, forming a high-k dielectric layer at least partly over the channel region, forming a gate electrode over the dielectric layer and at least partly over the channel region, the gate electrode being made substantially of metal, and forming a gate contact that engages the gate electrode at a location over the channel region.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
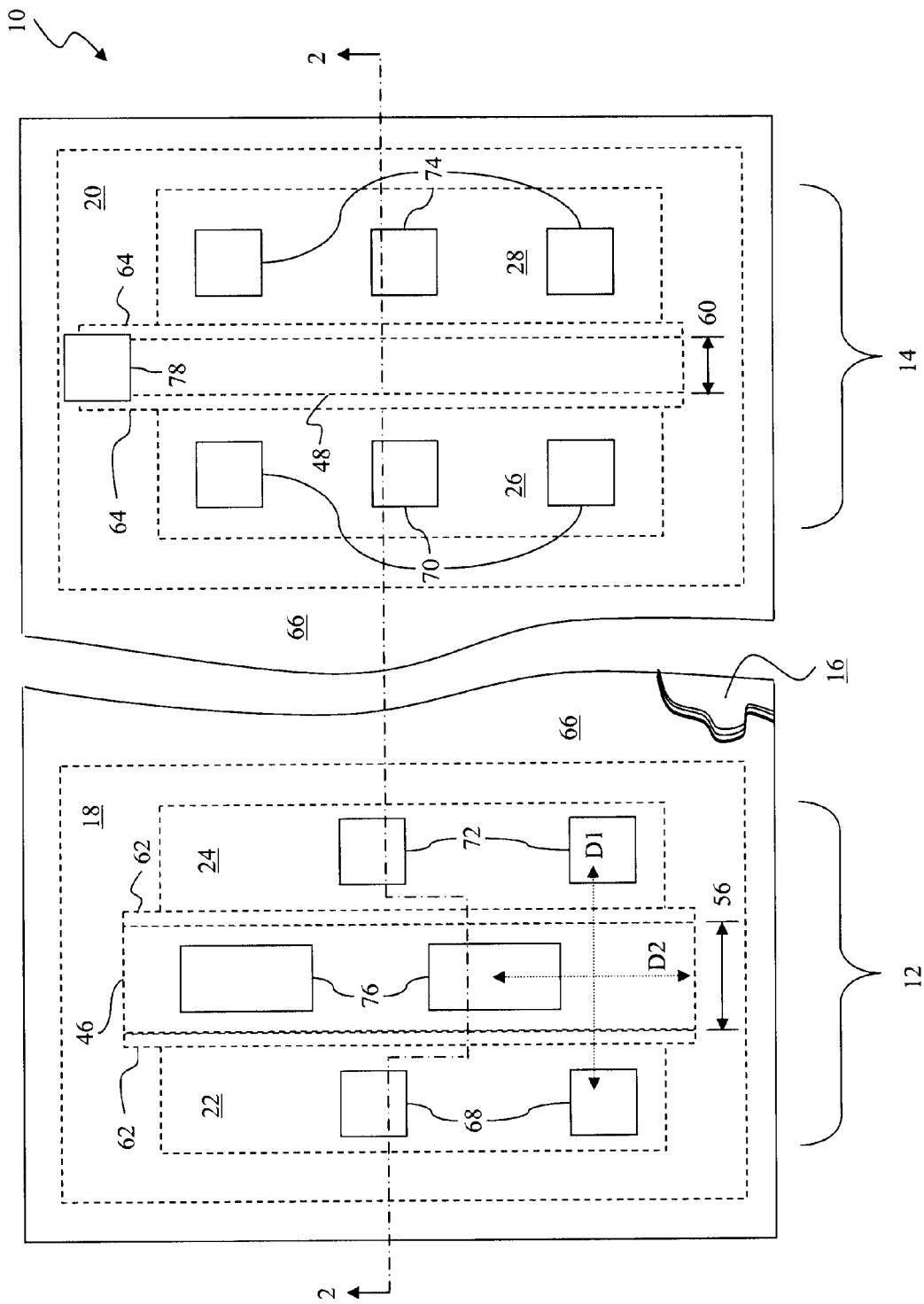
FIG. 1 is a diagrammatic top view of a semiconductor device.

It is to be understood that the following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed between the first and second features, such that the first and second features may not be in direct contact.

Figure 2:
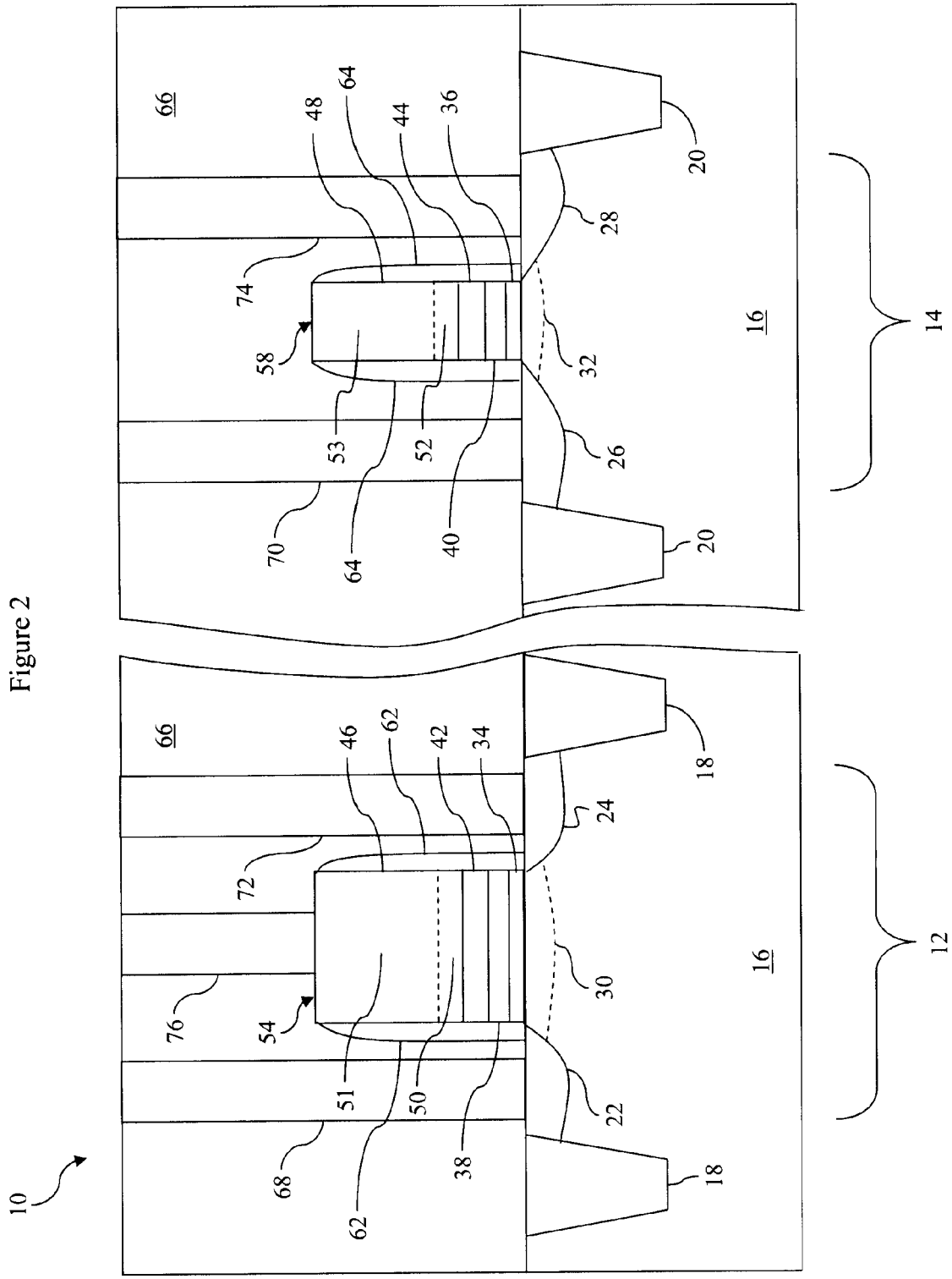
FIG. 2 is a diagrammatic sectional side view of the semiconductor device taken along line 2-2 in FIG. 1.

FIG. 1 is a diagrammatic top view of a semiconductor device 10, and FIG. 2 is a diagrammatic sectional side view taken along line 2-2 in FIG. 1. The semiconductor device 10 is an integrated circuit that includes an analog device 12 and a digital device 14. In the embodiment depicted in FIGS. 1-2, the analog device 12 and the digital device 14 are metal-oxide-semiconductor field effect transistors (MOSFETs). More specifically, they are p-channel MOSFETs (pMOS transistors) utilizing HKMG (high-k metal gate) technology. Alternatively, the analog device may be some other analog semiconductor device of a known type such as a radio frequency (RF) device, input/output (I/O) device, or amplifier. Alternatively, the digital device may be some other digital semiconductor device of a known type, such as a memory storage device (e.g., static random access memory (SRAM)). The analog device 12 and the digital device 14 are spaced apart from one another in the semiconductor device 10, however, they may alternatively be adjacent to one another or at any other location in the integrated circuit.

The semiconductor device 10 is formed on a silicon semiconductor substrate 16. Alternatively, the semiconductor substrate could be: an elementary semiconductor including germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

Insulating regions 18 and 20 are areas of dielectric material formed in trenches etched into the substrate 16. In the embodiment of FIGS. 1-2, the insulating regions 18 and 20 are annular and respectively extend around the analog and digital devices 12 and 14 to prevent electrical interference or crosstalk between these devices and other devices disposed on the substrate 16. The insulating regions 18 and 20 utilize shallow trench isolation (STI) to define and electrically isolate the analog and digital devices 12 and 14. The insulating regions 18 and 20 are composed of silicon oxide. However, in other alternative embodiments they could be silicon nitride, silicon oxynitride, other suitable materials, and/or combinations thereof. The insulating regions 18 and 20 may alternatively have a multi-layer structure such as a thermal oxide liner layer filled with silicon nitride or silicon oxide.

The substrate 16 includes source region 22 and drain region 24, which form parts of the analog device 12, and source region 26 and drain region 28, which form parts of the digital device 14. One outer boundary of each of the source region 22 and drain region 24 is defined by the insulating region 18, and one outer boundary of each of the source region 26 and drain region 28 is defined by the insulating region 20. These source and drain regions are doped wells having a dopant implanted therein that is appropriate for the design requirements of the encompassing device. Here, because they are parts of pMOS transistors, source and drain regions 22, 24, 26, and 28 are p-type wells doped with p-type dopants such as boron or $BF_2$ or combinations thereof. Alternatively, if the source and drain regions are parts of nMOS transistors, they may be n-type wells doped with n-type dopants, such as phosphorus or arsenic, or combinations thereof.

A channel region 30 is defined between the source region 22 and the drain region 24 in the substrate 16. The source region 22 and the drain region 24 are horizontally spaced apart in a direction D1, with the channel region 30 interposed between them and extending in a direction D2, perpendicular to the direction D1. Likewise, a channel region 32 is defined between the source region 26 and the drain region 28 in the digital device 14. The source region 26 and the drain region 28 are horizontally spaced apart in the direction D1, with the channel region 32 interposed between them and extending in the direction D2. The channel regions 30 and 32 are regions in the substrate 16 in which the majority carriers (in this case, holes) flow between the source and drain regions when analog device 12 and digital device 14 are in conduction mode.

Interfacial layers 34 and 36 are disposed on the substrate 16 and over the channel regions 30 and 32, respectively. The interfacial layers 34 and 36 are composed of silicon oxide (e.g., thermal oxide or chemical oxide) and have a thickness from about 5 angstroms (Å) to about 20 Å. Alternatively, the interfacial layers may include silicon oxynitride (SiON) or other oxide materials.

High-k dielectric layers 38 and 40 are respectively disposed on the interfacial layers 34 and 36 and over the channel regions 30 and 32. The dielectric layers 38 and 40 are composed of a dielectric material with a high dielectric constant. In embodiment of FIGS. 1-2, the dielectric layers 38 and 40 are $HfO_2$. Alternately, they could be HfSiO, HfSiON, HfTaO, HfTiO, HfZrO, AlO, ZrO, TiO, $Ta_2O_5$, $Y_2O_3$, $SrTiO_3$ (STO), $BaTiO_3$ (BTO), BaZrO, HfLaO, HfSiO, LaSiO, AlSiO, (Ba,Sr)$TiO_3$ (BST), $Al_2O_3$, $Si_3N_4$, oxynitrides, other suitable high-k dielectric materials, and/or combinations thereof. In an alternate embodiment, the dielectric layer 40 in the digital device 14 may simply be a standard dielectric material with a medium dielectric constant (about 3.9), for example $SiO_2$. The dielectric layers 38 and 40 have a thickness of about 10 Å to about 30 Å.

Barrier layers 42 and 44 (also referred to as capping layers, diffusion layers, or etch stop layers (ESL)) are respectively disposed on the high-k dielectric layers 38 and 40 and over the channel regions 30 and 32. The barrier layers 42 and 44 are composed of tantalum nitride. Alternatively, the barrier layers may include titanium, titanium nitride, tantalum, tungsten, aluminum, TaCN, TiAlN, TaSiN, WN, other suitable materials, and/or combinations thereof. In the present embodiment, the barrier layers 42 and 44 have a thickness of about 10 Å to about 200 Å.

Gate electrodes 46 and 48 are respectively disposed on the barrier layers 42 and 44 and over the channel regions 30 and 32. The gate electrodes 46 and 48 each have two portions, including respective work function layers 50 and 52 and respective metal layers 51 and 53. Specifically, the work function layers 50 and 52 are disposed in portions of the gate electrodes 46 and 48 nearest to the barrier layers 42 and 44. The metal layers 51 and 53 are disposed in the upper portions of gate electrodes 46 and 48. The portions of the gate electrodes 46 and 48 defined as the work function layers 50 and 52 have a work function value suitable to the type of device in which the layer is incorporated. A material's work function value is defined as the minimum energy needed to remove an electron from the material to a point immediately outside the material's surface. Here, the work function layers 50 and 52 are composed of titanium nitride (TiN), which is a p-type work function material, and have a thickness of about 10 Å to about 200 Å. Other p-type work function materials for a pMOS device include tungsten, tungsten nitride, or combinations thereof. Alternatively, n-type work function materials for an nMOS device include tantalum nitride, titanium aluminum, titanium aluminum nitride, or combinations thereof. The upper portions of the gate electrodes 46 and 48, respectively defined as metal layers 51 and 53, are composed of a conductive metal, specifically aluminum. Alternatively, the metal layers may include copper, tungsten, titanium, other suitable materials, and/or combinations thereof.

In an alternative embodiment, the work function layer may be omitted from the gate electrodes in analog and digital devices 12 and 14. Instead, the gate electrode may be an integral layer of metal and the gate structures may be tuned to have an appropriate work function value using other known methods.

A gate structure 54 is a part of the analog device 12 and includes the interfacial layer 34, the high-k dielectric layer 38, the barrier layer 42, and the gate electrode 46. The gate structure may alternatively contain a larger or smaller number of layers. The gate structure 54 (including its composition layers) is an elongate structure extending over the entirety of channel region 30 in the direction D2, its ends extending at least to the inner edges of the insulating region 18. Alternatively, the gate structure may be of any shape necessary for proper operation of the analog device or to accommodate other design considerations. For example, the gate structure 54 may have a dimension in the direction D2 longer than the channel region, and thus, it would extend over the insulating region 18. As shown in FIG. 1, the gate structure 54 has a gate length 56, which is approximately equal to the width of the channel region 30. The gate length of analog device 12 is in the range of 80-90 nm, but in other embodiments it may be larger or smaller.

A gate structure 58 is part of the digital device 14 and includes the interfacial layer 36, the high-k dielectric layer 40, the barrier layer 44, and the gate electrode 48. In an alternative embodiment, the gate structure of the digital device may contain a larger or smaller number of layers or be a non-HKMG gate. In the latter case, the gate structure 58 might contain only the dielectric layer and the gate electrode, where the dielectric layer is SiO2 and the gate electrode is an integral layer of polysilicon appropriately doped for the device type in which it is incorporated. The gate structure 58 is an elongate structure extending in the direction D2 over the entirety of the channel region 32 and at least partially over the insulating region 20. Alternatively, the portion of the gate structure 58 over the insulating region may have a larger width than the portion over the channel region so as to provide a larger surface area for connection with an interconnect structure (e.g., metal-1, metal-2, vias) of the semiconductor device. As shown in FIG. 1, the gate structure 58 has a gate length 60, which is approximately equal to the width of the channel region 32. In general, the gate length of an analog device is substantially larger than that of a digital (or core) device because analog applications have stricter linearity requirements than digital applications. Here, the gate length 56 of the gate structure 54 is approximately three times larger than the gate length 60 of the gate structure 58. In alternative embodiments, the gate length of the analog device may be of different sizes relative to the gate length of the digital device as necessary for proper operation of the integrated circuit.

The gate structure 54 includes two gate spacers 62 which abut each side of the interfacial layer 34, the high-k dielectric layer 38, the barrier layer 42, and the gate electrode 46 and extend the full length of each in the direction D2. Similarly, the gate structure 58 includes two gate spacers 64 which abut each side of the interfacial layer 36, the high-k dielectric layer 40, the barrier layer 44, and the gate electrode 48, and extend the full length of each in the direction D2. The gate spacers 62 and 64 are composed of a dielectric material. Here, they are silicon nitride. Alternatively, the gate spacers may be silicon carbide, silicon oxynitride, other suitable materials, and/or combinations thereof.

An interlayer (or inter-level) dielectric (ILD) layer 66 is formed over the substrate 16 and the gate structures 54 and 58. The ILD layer 66 is composed of silicon oxide. Alternatively, the ILD layer may include other dielectric materials such as silicon nitride, silicon oxynitride, TEOS formed oxide, phosphosilicate glass (PSG), borophosphosilicate glass (BPSG), low-k dielectric materials, other suitable dielectric materials, and/or combinations thereof. Exemplary low-k dielectric materials include fluorinated silica glass (FSG), carbon doped silicon oxide, Black Diamond® (Applied Materials of Santa Clara, Calif.), Xerogel, Aerogel, amorphous fluorinated carbon, Parylene, BCB (bis-benzocyclobutenes), SiLK (Dow Chemical, Midland, Mich.), polyimide, other proper materials, and/or combinations thereof. The ILD layer 66 can alternatively be a multilayer structure having multiple dielectric materials.

Two spaced source contacts 68 and two spaced drain contacts 72 extend downwardly through the ILD layer 66 and respectively engage the source region 22 and the drain region 24. The contacts electrically couple the analog device 12 to the non-illustrated interconnect structure of semiconductor device 10. In the embodiment of FIGS. 1-2, the source contacts 68 and the drain contacts 72 are each square in a top view. Alternatively, however, a larger or smaller number of contacts may engage the source and drain regions and the contacts may be any of a variety of different shapes. As shown in FIG. 1, each of the source contacts 68 is approximately aligned in the direction D2 with a respective one of the drain contacts 72. Alternatively, the contacts 68 and 72 may each be placed in any location above the source and drain regions to facilitate better operation of the analog device. In the present embodiment, the source contacts 68 and drain contacts 72 are composed of copper, but they could alternatively include various other suitable conductive materials such as tungsten.

Three spaced source contacts 70 and three spaced drain contacts 74 extend downwardly through the ILD layer 66 and respectively engage the source region 26 and the drain region 28, electrically coupling the digital device 14 to the interconnect structure of semiconductor device 10. Although three contacts of each type (70 and 74) are shown in the embodiment of FIGS. 1-2, a larger or smaller number of contacts may engage the source and drain regions 26 and 28. Source contacts 70 and drain contacts 74 are substantially identical in size, shape, and material to the source and drain contacts 68 and 72, but in alternative embodiments they may differ in size, shape or material.

Two spaced gate contacts 76 extend downwardly through the ILD layer 66 and engage the gate electrode 46 at respective locations over the channel region 30. The gate contacts 76 electrically couple the analog device 12 to the interconnect structure of semiconductor device 10. The gate contacts 76 are approximately rectangular in shape in a top view, with the longer edge of each extending approximately in the direction D2 and approximately parallel to a longer edge of the gate structure 54. The width of the gate contacts 76 in the direction D1 is smaller than the gate length 56 of the gate structure 54. Further, the gate contacts 76 are staggered with respect to the source contacts 68 and drain contacts 72 in the direction D2, as shown in FIG. 1. Staggering the gate contacts and the source and drain contacts increases the distance between the nearest points of the gate contacts and the nearby source and drain contacts, and thus helps prevent electrical shorts (bridging) between the gate contacts and the source and drain contacts. In the embodiment of FIGS. 1-2, a pair of gate contacts 76 engage the gate electrode 46, however, a larger or smaller number of gate contacts may engage the gate electrode, and they may have any of a variety of different shapes. In the present embodiment, the gate contacts 76 and are composed of copper, but they may alternatively include other various suitable conductive materials such as tungsten.

A gate contact 78 extends downwardly through the ILD layer 66 and engages the gate electrode 48 at a location over insulating region 20. The gate contact 78 electrically couples the digital device 14 to the interconnect structure of semiconductor device 10. The width of the gate contact 78 is larger than the gate length 60 and, hence, a portion of the gate contact 78 engages the gate spacers 64 and insulating region 20. Alternatively, the width of the gate contact may be equal to or smaller than the gate length 60 of the digital device, wherein the entire lower end of the gate contact would engage the gate electrode. In the present embodiment, the gate contact 78 is composed of copper but it could alternatively include various other suitable conductive materials such as tungsten.

As noted above, the integrated circuit shown in FIGS. 1-2 contains both analog and digital devices. In the current embodiment, the respective gate lengths 56 and 60 of the devices differ substantially in that the analog device's gate length is roughly three times larger than the digital device's gate length. This difference allows for other structural differences. The larger gate length of the analog device 12 permits placement of the gate contacts 76 on the gate electrode 46 directly over the channel region 30 because the excess surface area of the gate electrode around the contacts allows for deviation of the gate contact from the intended engagement position without bridging between the gate and the source or drain. Thus, the gate contacts 76 of the analog device 12 engage the gate electrode 46 over the channel region 30 whereas the gate contact 78 of the digital device 14 engages the gate electrode 48 over the insulating region 20.

A side effect of manufacturing analog devices with high-k metal gate technology is increased gate resistance. In HKMG devices, such as analog device 12, the multitude of layers in the gate structure 54 increases gate resistance over non-HKMG devices. Unfortunately, an increase in gate resistance in analog devices is more harmful than a comparable increase in digital devices because of the former's stricter linearity requirements. However, by placing the gate contacts 76 on the gate electrode 46 over channel region 30, this additional resistance is negated to some extent. Gate contact directly over the channel region, as found in analog device 12, decreases the effective gate resistance because the distance from gate contact to gate dielectric is reduced. Further, an increase in the number of gate contacts over the channel region also decreases effective gate resistance because the surface area of the engagement between the gate electrode and the gate contacts is increased and also because the average distance from gate contact to gate dielectric is reduced.

The semiconductor device 10 is not limited to the aspects of the integrated circuit described above. More specifically, the integrated circuit in the semiconductor device 10 can further include passive components such as resistors, capacitors, inductors, and/or fuses; and active components, such as MOSFETs including p-channel MOSFETs (pMOS transistors) and n-channel MOSFETs (nMOS transistors), complementary metal-oxide-semiconductor transistors (CMOSs), high voltage transistors, and/or high frequency transistors; other suitable components; and/or combinations thereof.

With reference now to FIGS. 3-8, a method to manufacture the analog device 12 of FIGS. 1-2 is described. FIGS. 3-8 are diagrammatic sectional side views of the analog device 12 during various successive stages of manufacture.

Figure 3:
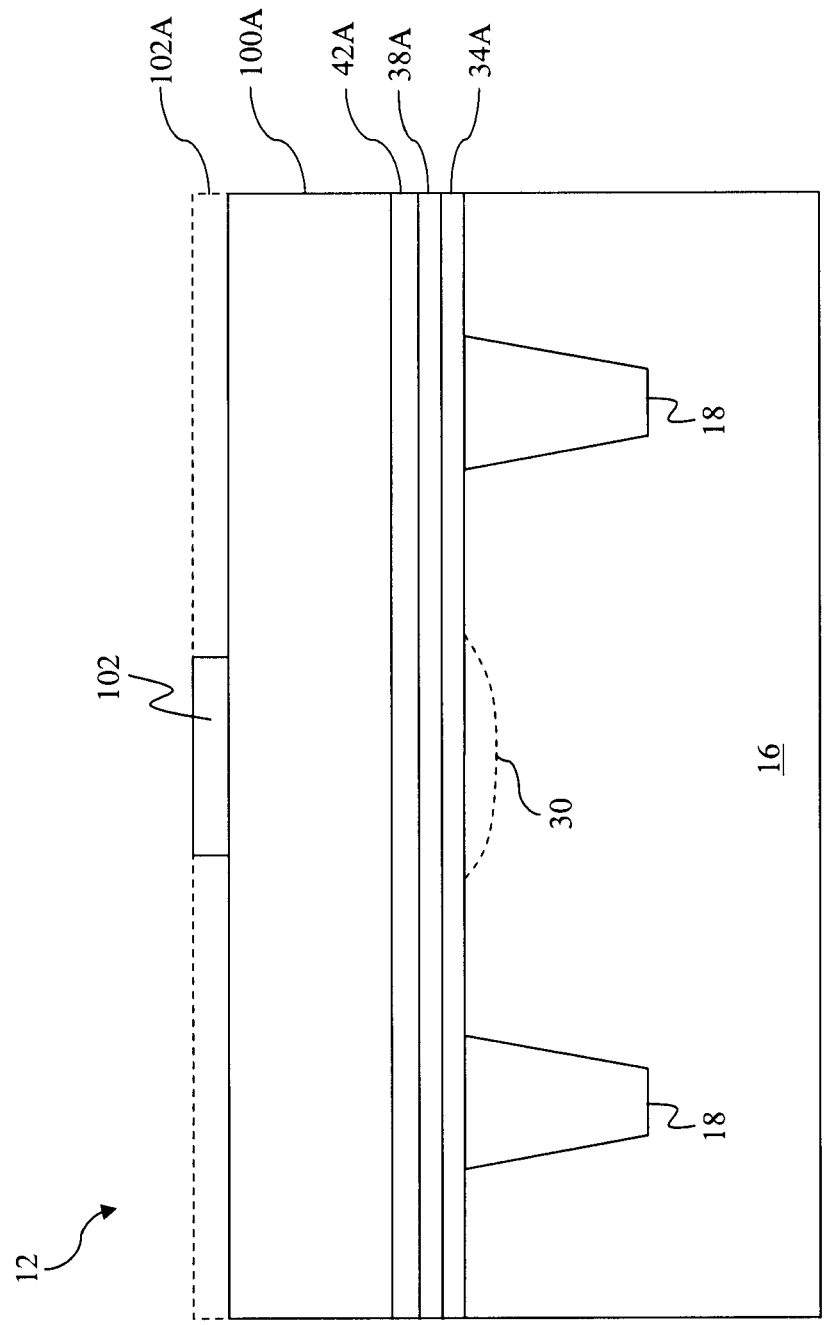
FIGS. 3-8 are diagrammatic sectional side views of a portion of the semiconductor device of FIGS. 1-2 during various successive stages of manufacture.
Figure 4:
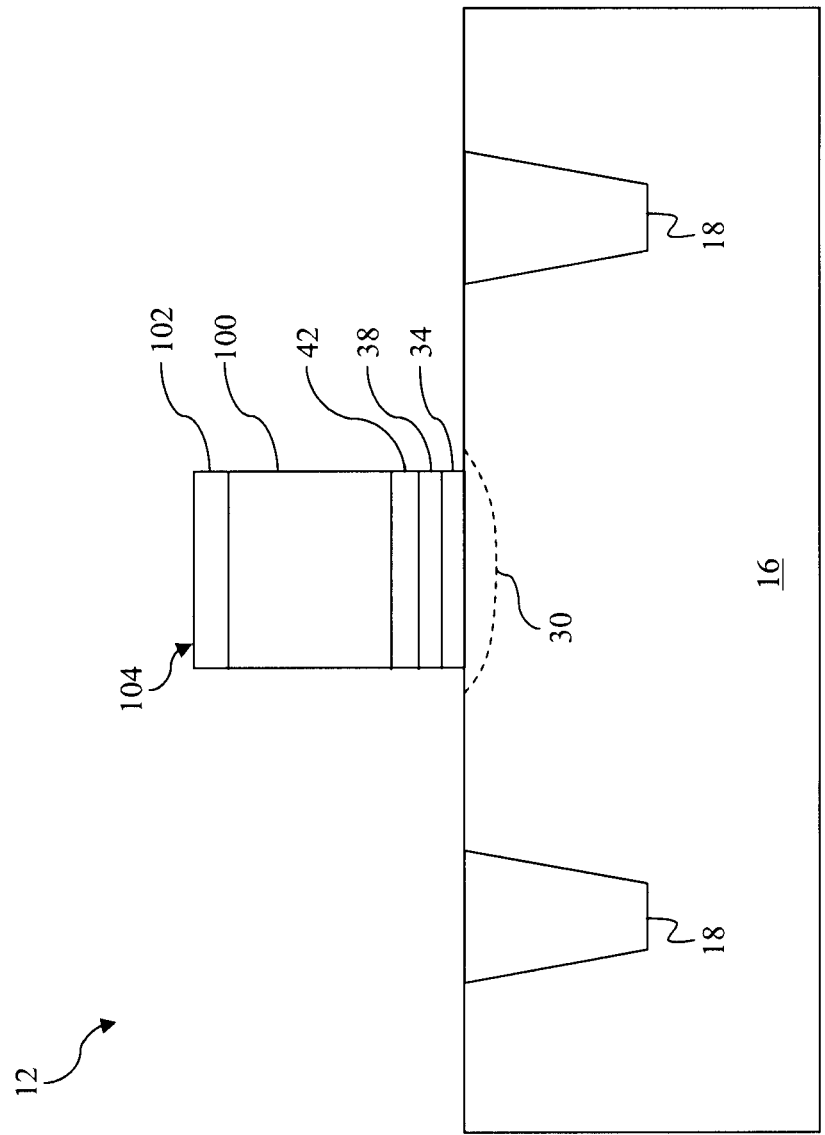

Referring to FIG. 3, the silicon semiconductor substrate 16 is provided. The insulating region 18 is formed in the substrate 16 to surround and isolate the region in which the analog device 12 will operate. The insulating region 18 utilizes shallow trench isolation (STI) technology and is formed in a known manner by etching a trench in the substrate and then filling the trench with silicon oxide. The above may be accomplished by any suitable process which may include dry etching, wet etching and a chemical vapor deposition process. Additionally, the channel region 30 is identified in the substrate 16. At this point in the manufacturing process, the channel region 30 is a reference region around which the remaining elements of the analog device 12 will be formed.

Next, an interfacial layer 34A with thickness of about 5 Å to 20 Å is formed over the substrate 16 including the channel region 30. The interfacial layer 34A is silicon oxide and is deposited using chemical vapor deposition (CVD). A high-k dielectric layer 38A composed of HfO2 is subsequently formed by CVD over the interfacial layer 34A. The dielectric layer 38A is deposited to a thickness of about 10 Å to about 30 Å. Next, a barrier layer 42A of tantalum nitride is formed by CVD over the dielectric layer 38A. The barrier layer 42A is deposited to a thickness of about 10 Å to about 200 Å.

A dummy gate layer 100A is subsequently formed by CVD over the barrier layer 42A. In the present embodiment, the dummy gate layer 100A is polysilicon. Alternatively, other comparable materials may be deposited to form the dummy gate layer 100A, and the dummy gate layer 100A can include multiple material layers. Next, a hard mask layer 102A is formed over the dummy gate layer 100A using CVD. The hard mask layer 102A is silicon nitride in the present embodiment but alternatively may be silicon oxynitride, silicon carbide, or other suitable material. The above-described layers 34A, 38A, 42A, 100A, and 102A may alternatively be formed using any suitable process, such as physical vapor deposition (PVD), atomic layer deposition (ALD), high density plasma CVD (HDPCVD), metal organic CVD (MOCVD), remote plasma CVD (RPCVD), plasma enhanced CVD (PECVD), plating, other suitable methods, and/or combinations thereof.

A photolithography process is next employed to remove the portions of layers 34A, 38A, 42A, 100A, 102A not disposed over the channel region 30. Specifically, a non-illustrated photoresist layer is formed over the hard mask layer 102A by a standard process and is subsequently patterned to protect the portion of layers 34A, 38A, 42A, 100A, 102A disposed over the channel region 30. Etching then removes portions of hard mask layer 102A, leaving a hard mask layer 102 to protect the layer portions below the layer 102 and above the channel region 30. The remaining photoresist is then stripped and subsequent etching is performed to create a temporary gate stack 104, shown in FIG. 4, that includes the hard mask layer 102, a dummy gate layer 100, the barrier layer 42, the high-k dielectric layer 38, and the interfacial layer 34. The photolithography patterning process may include any number of suitable steps including photoresist coating (e.g., spin-on coating), soft baking, mask aligning, exposure, post-exposure baking, developing the photoresist, rinsing, drying (e.g., hard baking), other suitable processes, and/or combinations thereof. Further, the photolithography exposing process may be wholly replaced by other proper methods, such as maskless photolithography, electron-beam writing, or ion-beam writing. The etching processes include dry etching, wet etching, and/or other etching methods. It is understood that the above example does not limit the processing techniques that may be utilized to form the temporary gate stack. It is further understood that the temporary gate stack can include additional layers.

Figure 5:
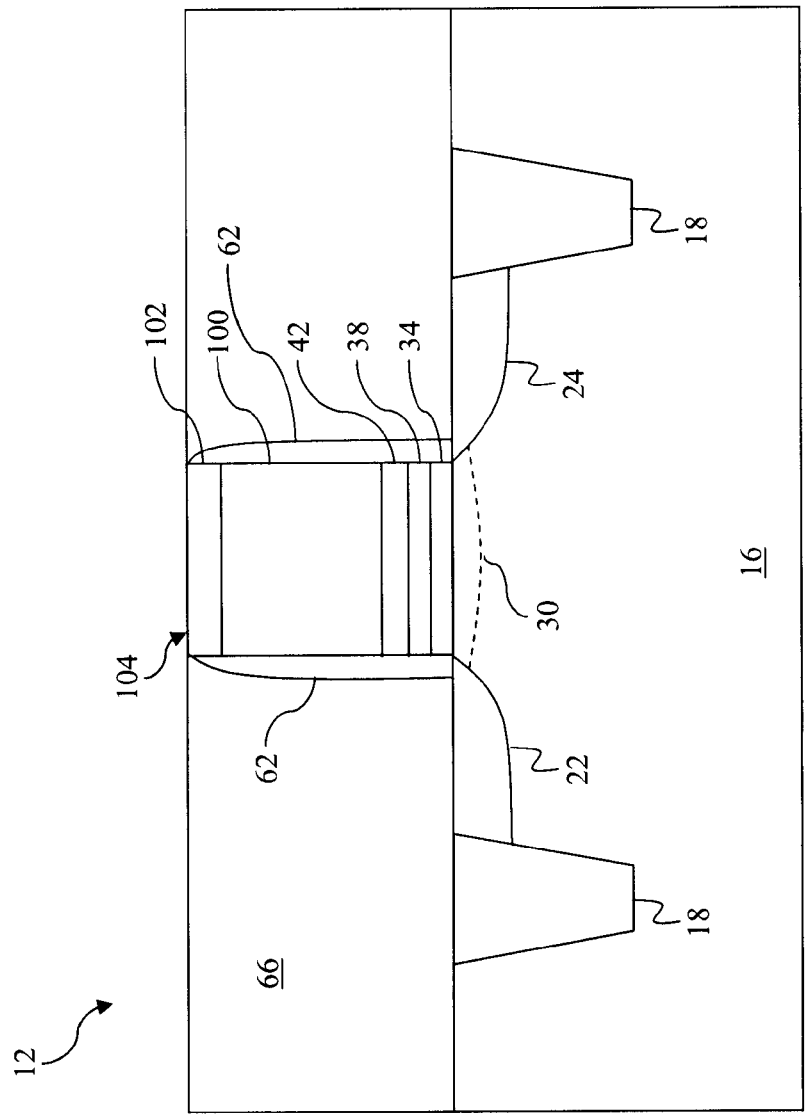

Referring now to FIG. 5, subsequent processing includes forming the source region 22 and the drain region 24 in substrate 16. In particular, an ion implantation process is utilized to dope the substrate 16 between the temporary gate stack 104 and the insulating region 18 with p-type dopants to create the source and drain regions 22 and 24. In addition to the ion implantation process, a photolithography process, diffusion process, and annealing process (e.g., rapid thermal annealing and/or laser annealing processes) are utilized to create the source and drain regions 22 and 24. Alternatively, the source and drain regions 22 and 24 can include raised source/drain regions. The raised source/drain regions can be formed by an epitaxy process, such as a CVD deposition techniques (e.g., vapor-phase epitaxy (VPE) and/or ultra-high vacuum CVD (UHV-CVD)), molecular beam epitaxy, and/or other suitable processes.

Next, the gate spacers 62 are formed in a known manner along the full length of each side of the temporary gate stack 104. Silicon nitride, a dielectric material, is deposited on the temporary gate stack 104 to form the gate spacers 62.

An interlayer (or inter-level) dielectric (ILD) layer 66 is next formed over the substrate 16, gate spacers 62, and the temporary gate stack 104. The ILD layer 66 is composed of silicon oxide. Subsequent to the deposition of the ILD layer 66, a chemical mechanical polishing (CMP) process is performed, such that a top portion of the temporary gate stack 104 is exposed. Particularly, a top portion of the hard mask layer 102 is exposed, as shown in FIG. 5.

Figure 6:
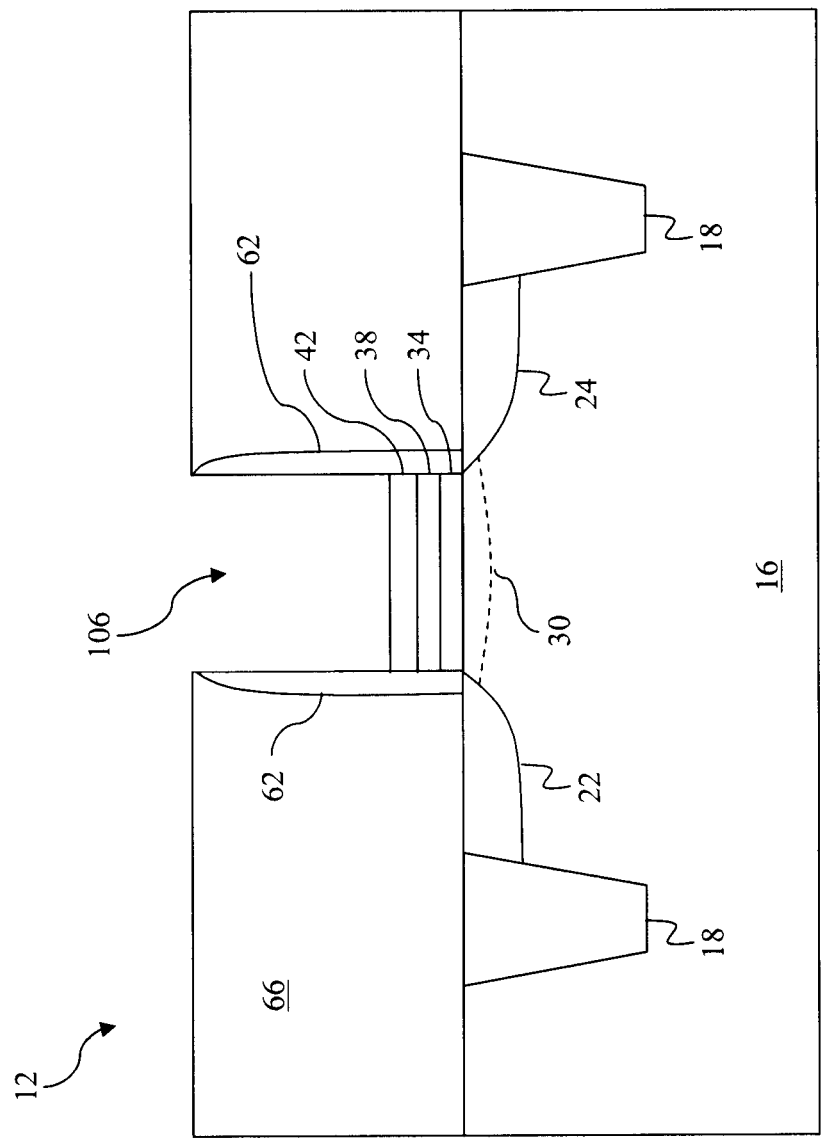
Figure 7:
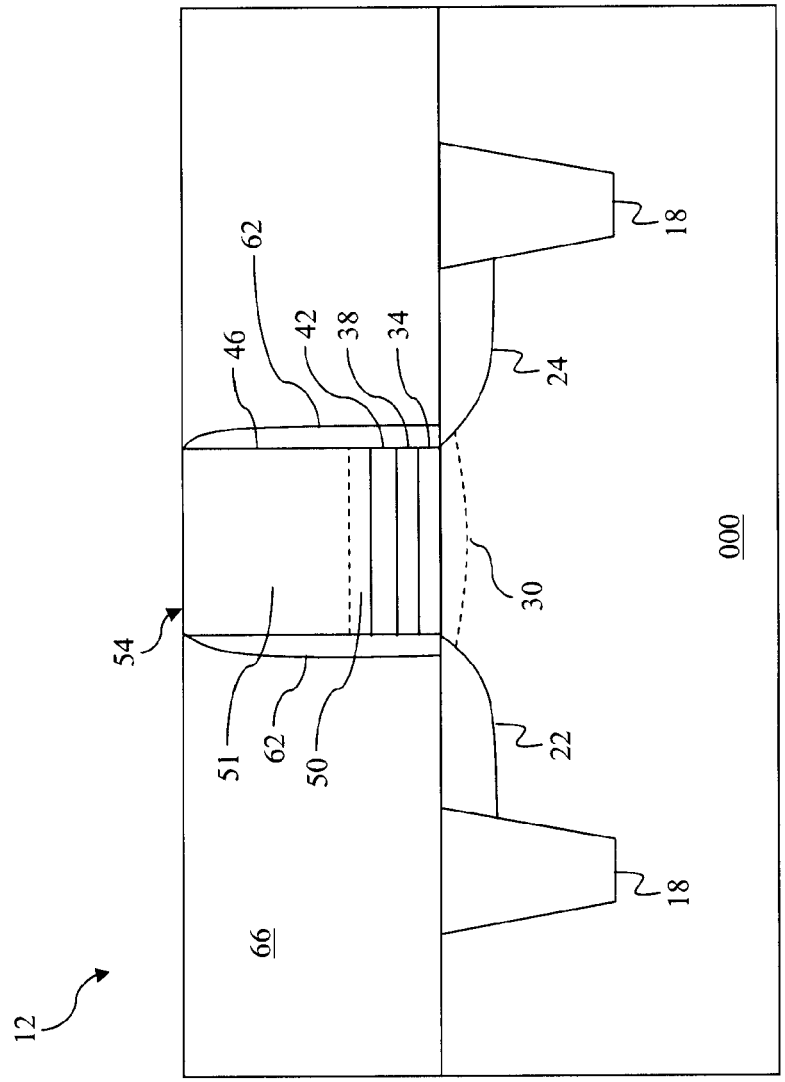

Referring now to FIGS. 6 and 7, a gate replacement process is performed, wherein the top two layers of the temporary gate stack 104 are removed and replaced with a gate electrode 46. In particular, FIG. 6 illustrates the removal of the dummy gate layer 100 and the hard mask layer 102 from the temporary gate stack 104. A non-illustrated photoresist layer is deposited and patterned to facilitate the removal. After etching away the layers 100 and 102 and stripping the photoresist, the barrier layer 42 and the gate spacers 62 respectively define a bottom and sides of an opening 106. The hard mask layer 102 and dummy gate layer 100 may be removed from the temporary gate stack 104 simultaneously or independently by any suitable process, such as a dry etching and/or wet etching process. Next, as shown in FIG. 7, the gate electrode 46 is formed in the opening 106 over the barrier layer 42. Specifically, forming the gate electrode 46 includes forming the work function layer 50 over the barrier layer 42 and the metal layer 51 over the work function layer 50. In the present embodiment, the work function layer 50 is formed by the deposition of titanium nitride to a thickness of about 10 Å to 200 Å and the metal layer 51 is formed by the deposition of aluminum up to the top of the opening 106. In alternate embodiments, the gate electrode may be formed with only the metal layer 51 and the gate structure may be tuned to have an appropriate work function value in other known ways. Subsequent to the formation of the gate electrode 46, a CMP process is performed to planarize the top portions of the gate electrode 46 and the ILD layer 66.

Figure 8:
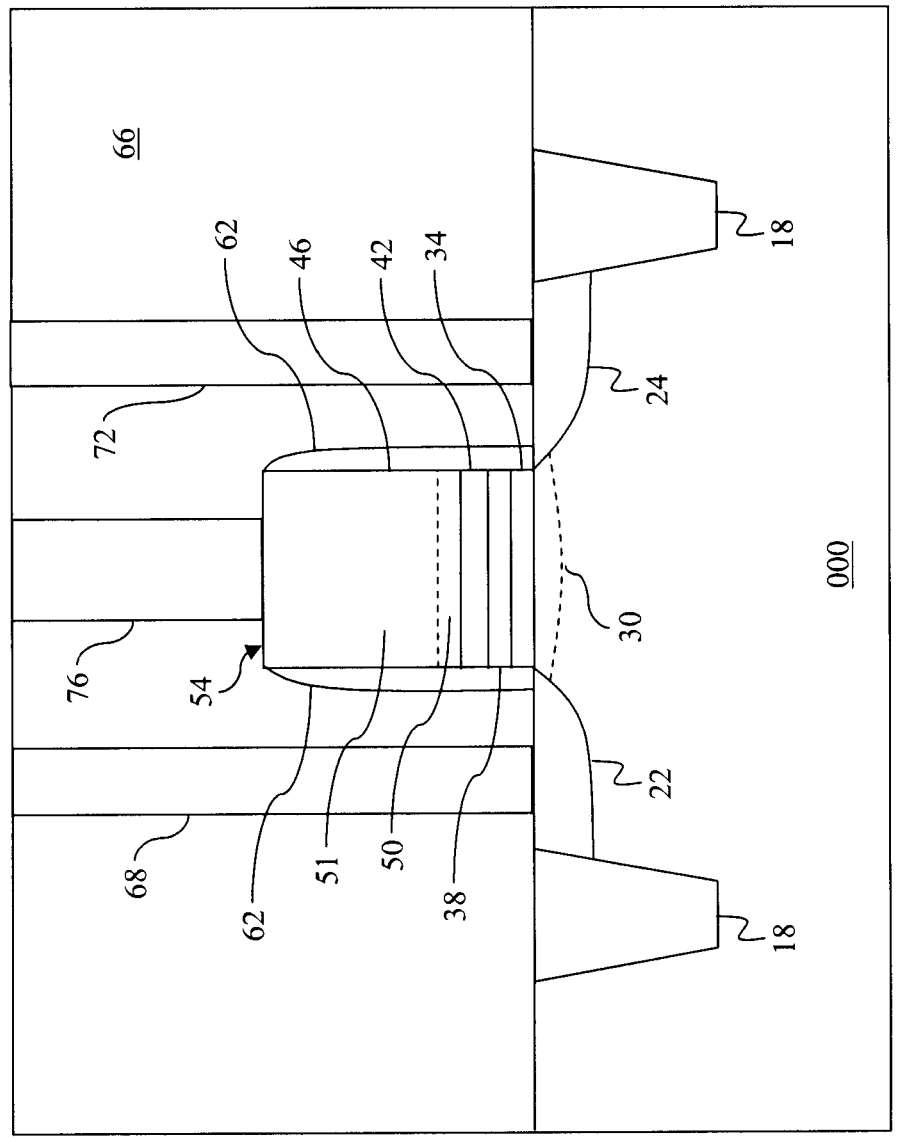

Referring now to FIG. 8, the ILD layer 66 is increased in size in a vertical dimension by the deposition of additional silicon oxide over the gate structure 54 and the previously deposited ILD material. Next, source contacts 68 and drain contacts 72 are formed through the ILD layer 66 to engage source region 22 and drain region 24, respectively. Specifically, square-shaped openings are etched into the ILD layer 66 at respective locations over the source and drain regions 22 and 24, exposing portions of these regions. The openings are subsequently filled with copper. Next, gate contacts 76 are formed through the ILD layer 66 to engage the gate electrode 46 at locations over the channel region 30. Specifically, rectangular openings are etched into the ILD layer 66 at locations above the gate electrode 46 and over the channel region 30, exposing portions of the gate electrode 46. The openings are subsequently filled with copper. The above contact formation process may include photolithography, etching, stripping, deposition, and any other appropriate procedures. Lastly, a CMP process is performed to planarize the top portions of the source, drain, and gate contacts 68, 72, and 76 and the ILD layer 66.

Figure 9:
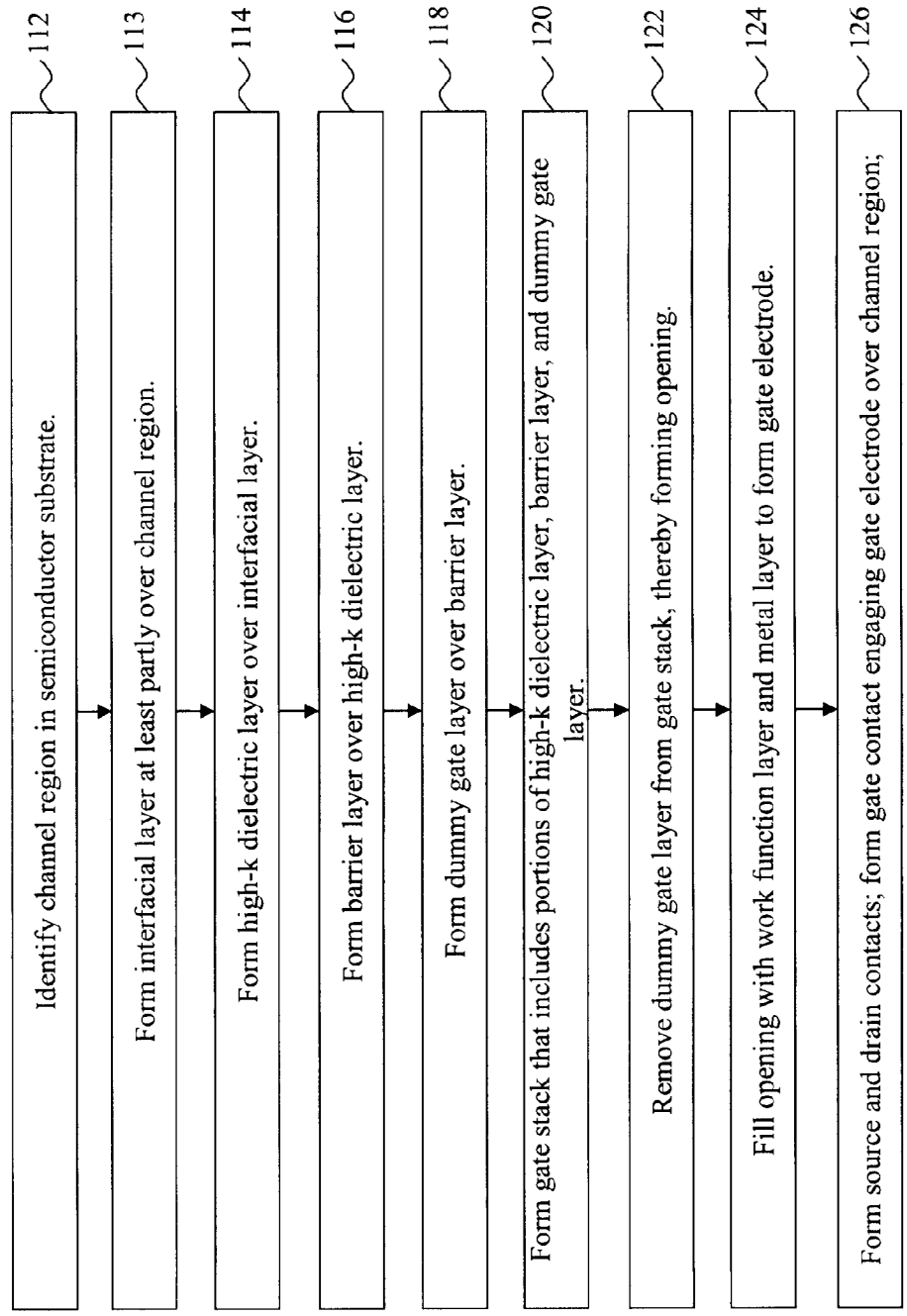
FIG. 9 is a high-level flowchart showing a process that will be described in association with FIGS. 3-8.

FIG. 9 is a high-level flowchart showing a process 110 that was described above in association with FIGS. 3-8. Process 110 begins at block 112 where the channel region 30 is identified in the semiconductor substrate 16. The process 110 proceeds to block 113 where the interfacial layer 34A is formed at least partly over the channel region. Then, in block 114, the high-k dielectric layer 38A is formed over the interfacial layer. Next, in block 116, the barrier layer 42A is formed over the high-k dielectric layer and at least partly over the channel region. Process 110 proceeds to block 118, where the dummy gate layer 100A is deposited over the barrier layer. Then, in block 120, a photolithography process is utilized to form over the channel region a temporary gate stack 104 that includes portions 38, 42, and 100 of the high-k dielectric layer, barrier layer, and dummy gate layer. Also, the ILD layer 66 is formed over the substrate and the temporary gate stack.

A gate replacement process is then performed over the course of blocks 122 and 124. Specifically, in block 122, the dummy gate layer is removed from the temporary gate stack, which creates the opening 106 above the barrier layer. Next, in block 124, the opening is filled with the work function layer 50 and metal layer 51 to form the gate electrode 46. Also, ILD layer 66 is enlarged in a vertical dimension. Finally, process 110 proceeds to block 126, where the source contacts 68 and the drain contacts 72 are formed over the source and drain regions, respectively. Also, gate contact 76 is formed to engage the gate electrode at a location over the channel region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduce herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An apparatus comprising a semiconductor device that includes:
   a semiconductor substrate having a channel region;
   a high-k dielectric layer disposed at least partly over the channel region;
   a gate electrode disposed over the dielectric layer and disposed at least partly over the channel region, wherein the gate electrode is made substantially of metal, wherein the gate electrode has an approximately elongate shape in a top view with a longer edge extending in substantially a first direction; and
   a gate contact engaging the gate electrode at a location over the channel region, wherein a surface of the gate contact that is in physical contact with the gate electrode has an elongate shape in a top view, wherein the gate contact has an approximately elongate rectangular shape in the top view with a longer edge extending in substantially the first direction.

2. An apparatus according to claim 1, wherein the semiconductor device includes a barrier layer disposed at least partly over the channel region and interposed between the dielectric layer and the gate electrode.

3. An apparatus according to claim 2, wherein the gate electrode includes a work function layer disposed in a portion of the gate electrode nearest the barrier layer.

4. An apparatus according to claim 1, wherein the gate electrode includes a work function layer disposed in a portion of the gate electrode nearest the dielectric layer.

5. An apparatus according to claim 1, wherein the semiconductor device includes a plurality of further gate contacts engaging the gate electrode at respective spaced locations over the channel region.

6. An apparatus according to claim 5,
   wherein the semiconductor device includes a source region and a drain region disposed within the substrate on opposite sides of the channel region, the source region and the drain region being horizontally spaced apart in a second direction substantially perpendicular to the first direction;
   wherein the semiconductor device includes a plurality of source contacts engaging the source region at spaced locations and a plurality of drain contacts engaging the drain region at spaced locations, each of the source contacts being approximately aligned in the first direction with a respective one of the drain contacts; and wherein the gate contacts are staggered with respect to the source contacts and drain contacts in the first direction.

7. An apparatus according to claim 6, wherein the gate contacts each have an approximately elongate rectangular shape in the top view with the longer edge extending in approximately the first direction.

8. An apparatus according to claim 1,
wherein the semiconductor device includes a source region and a drain region disposed within the substrate on opposite sides of the channel region, the source region and the drain region being horizontally spaced apart in a second direction substantially perpendicular to the first direction.

9. An apparatus according to claim 1, including an integrated circuit that includes the gate contact and that has the semiconductor device implemented as a field effect transistor therein, the field effect transistor including the channel region and having a gate structure, wherein the dielectric layer and the gate electrode are portions of the gate structure.

10. An apparatus according to claim 1, wherein the semiconductor device is an analog device.

11. An apparatus comprising an integrated circuit including:
a semiconductor substrate having spaced first and second channel regions and an insulating region;
a high-k first dielectric layer disposed at least partly over the first channel region;
a second dielectric layer disposed at least partly over the second channel region and at least partly over the insulating region;
a first gate electrode disposed over the first dielectric layer and at least partly over the first channel region, wherein the first gate electrode is made substantially of metal;
a second gate electrode disposed over the second dielectric layer, and having a first portion disposed over the second channel region and a second portion disposed over the insulating region;
a first gate contact engaging the first gate electrode at a location over the first channel region; and
a second gate contact engaging the second gate electrode at a location over the insulating region, the second gate electrode being free of engagement with contacts over the second channel.

12. An apparatus according to claim 11, wherein the first gate electrode has a first gate length and the second gate electrode has a second gate length substantially less than the first gate length.

13. An apparatus according to claim 12,
wherein the integrated circuit has an analog device that includes the first channel region, the first dielectric layer, and the first gate electrode; and
wherein the integrated circuit has a digital device that includes the second channel region, the second dielectric layer, and the second gate electrode.

14. An apparatus according to claim 11,
wherein the integrated circuit includes a source region and a drain region disposed within the substrate on opposite sides of the first channel region, the source region and the drain region being horizontally spaced apart in a first direction;
wherein the first gate electrode includes an elongate portion extending over the first channel region in a second direction approximately perpendicular to the first direction; and wherein the first gate contact has an approximately rectangular shape in a top view with the longer edge extending in approximately the second direction.

15. An apparatus according to claim 11, wherein the integrated circuit includes a plurality of further gate contacts engaging the first gate electrode at respective spaced locations over the first channel region.

16. An apparatus according to claim 15,
wherein the integrated circuit includes a source region and a drain region disposed within the substrate on opposite sides of the first channel region, the source region and the drain region being horizontally spaced apart in a first direction;
wherein the first gate electrode includes an elongate portion extending over the first channel region in a second direction approximately perpendicular to the first direction;
wherein the integrated circuit includes a plurality of source contacts engaging the source region at spaced locations and a plurality of drain contacts engaging the drain region at spaced locations, each of the source contacts being approximately aligned in the second direction with a respective one of the drain contacts; and
wherein the first gate contact and further gate contacts are staggered with respect to the source contacts and drain contacts in the second direction.

17. An apparatus according to claim 11, wherein the integrated circuit includes a barrier layer disposed at least partly over the first channel region and interposed between the first dielectric layer and the first gate electrode.

18. A method for making a semiconductor device, the method comprising:
providing a semiconductor substrate having a channel region;
forming a high-k dielectric layer at least partly over the channel region;
forming a gate electrode over the dielectric layer and at least partly over the channel region, the gate electrode being made substantially of metal wherein the forming the gate electrode includes providing an elongate shape in a top view with a longer edge extending in approximately a first direction; and
forming a gate contact that engages the gate electrode at a location over the channel region, wherein a surface of the gate contact that is in physical contact with the gate electrode, wherein the forming the gate contact includes providing an elongate shape in the top view with a longer edge extending in approximately the first direction.

19. A method according to claim 18,
including forming a source region and a drain region within the substrate on opposite sides of the channel region, the source region and the drain region being horizontally spaced apart in a second direction substantially perpendicular to the first direction.

20. A method according to claim 18,
including forming a source region and a drain region disposed within the substrate on opposite sides of the channel region, the source region and the drain region being horizontally spaced apart in a second direction the second direction substantially perpendicular to the first direction;
including forming a plurality of source contacts engaging the source region at spaced locations and a plurality of drain contacts engaging the drain region at spaced locations, each of the source contacts being approximately aligned in the first direction with a respective one of the drain contacts; and including forming a plurality of further gate contacts engaging the gate electrode at respective locations over the channel region, the gate contacts being staggered with respect to the source contacts and drain contacts in the first direction.

* * * * *